(12) United States Patent
Dolbear et al.

(10) Patent No.: US 10,957,669 B2
(45) Date of Patent: Mar. 23, 2021

(54) BACK SIDE METALLIZATION

(71) Applicant: ADVANCED MICRO DEVICES, INC., Santa Clara, CA (US)

(72) Inventors: Thomas P. Dolbear, Austin, TX (US); Daniel Cavasin, Georgetown, TX (US); Sanjay Dandia, San Jose, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/540,134

(22) Filed: Aug. 14, 2019

(65) Prior Publication Data

US 2019/0371758 A1    Dec. 5, 2019

Related U.S. Application Data

(60) Continuation of application No. 16/260,794, filed on Jan. 29, 2019, now Pat. No. 10,431,562, which is a
(Continued)

(51) Int. Cl.
*H01L 23/367* (2006.01)
*H01L 23/00* (2006.01)
(Continued)

(52) U.S. Cl.
CPC .......... *H01L 24/29* (2013.01); *H01L 21/4871* (2013.01); *H01L 21/78* (2013.01); *H01L 23/3675* (2013.01); *H01L 24/27* (2013.01); *H01L 24/94* (2013.01); *H01L 25/0655* (2013.01); *H01L 25/50* (2013.01); *C23C 16/06* (2013.01); *C23C 16/345* (2013.01); *H01L 23/36* (2013.01); *H01L 24/13* (2013.01); *H01L 24/16* (2013.01); *H01L 25/18* (2013.01); *H01L 2224/13101* (2013.01); *H01L 2224/16145* (2013.01); *H01L 2224/2745* (2013.01); *H01L 2224/27452* (2013.01); *H01L 2224/27849* (2013.01); *H01L 2224/29084* (2013.01);
(Continued)

(58) Field of Classification Search
CPC . H01L 23/3042; H01L 23/3675; H01L 23/42; H01L 24/17; H01L 24/27; H01L 24/29; H01L 24/94; H01L 25/0655; H01L 25/50
See application file for complete search history.

(56) References Cited

U.S. PATENT DOCUMENTS

7,256,062 B2    8/2007   Fukano et al.
7,513,035 B2    4/2009   Too et al.
(Continued)

*Primary Examiner* — Cuong Q Nguyen
(74) *Attorney, Agent, or Firm* — Faegre Drinker Biddle & Reath LLP (57) ABSTRACT

An integrated circuit device wafer includes a silicon wafer substrate and a back side metallization structure. The back side metallization structure includes a first adhesion layer on the back side of the substrate, a first metal later over the first adhesion layer, a second metal layer over the first metal layer, and a second adhesion layer over the second metal layer. The first includes at least one of: silicon nitride and silicon dioxide. The first metal layer includes titanium. The second metal layer includes nickel. The second adhesion layer includes at least one of: silver, gold, and tin. An indium preform is placed between the second adhesion layer and the lid and the indium preform is reflowed.

5 Claims, 8 Drawing Sheets

Related U.S. Application Data division of application No. 15/669,361, filed on Aug. 4, 2017, now Pat. No. 10,242,962.

(51) Int. Cl.
  *H01L 25/00* (2006.01)
  *H01L 21/48* (2006.01)
  *H01L 21/78* (2006.01)
  *H01L 25/065* (2006.01)
  *C23C 16/06* (2006.01)
  *C23C 16/34* (2006.01)
  *H01L 25/18* (2006.01)
  *H01L 23/36* (2006.01)

(52) U.S. Cl.
  CPC .......... *H01L 2224/29109* (2013.01); *H01L 2224/29111* (2013.01); *H01L 2224/29124* (2013.01); *H01L 2224/29139* (2013.01); *H01L 2224/29144* (2013.01); *H01L 2224/29155* (2013.01); *H01L 2224/29166* (2013.01); *H01L 2224/29172* (2013.01); *H01L 2224/29188* (2013.01); *H01L 2224/29678* (2013.01); *H01L 2224/73253* (2013.01); *H01L 2224/81815* (2013.01); *H01L 2924/05042* (2013.01); *H01L 2924/05442* (2013.01); *H01L 2924/10253* (2013.01); *H01L 2924/14* (2013.01); *H01L 2924/16195* (2013.01); *H01L 2924/171* (2013.01)

(56) References Cited

U.S. PATENT DOCUMENTS

| | | | |
|---|---|---|---|
| 7,544,542 B2 | 6/2009 | Too et al. | |
| 7,633,151 B2 | 12/2009 | Too et al. | |
| 7,651,938 B2 | 1/2010 | Too et al. | |
| 7,678,615 B2 | 3/2010 | Touzelbaev et al. | |
| 7,745,264 B2 | 6/2010 | Zhai et al. | |
| 8,299,633 B2 * | 10/2012 | Su | H01L 24/29 257/798 |
| 8,723,314 B2 | 5/2014 | Su | |
| 10,242,962 B1 | 3/2019 | Dolbear et al. | |
| 2005/0280142 A1 * | 12/2005 | Hua | H01L 23/3736 257/707 |
| 2008/0203571 A1 | 8/2008 | Jungnickel | |
| 2017/0092616 A1 | 3/2017 | Su | |

* cited by examiner

BACK SIDE METALLIZATION

RELATED APPLICATIONS

This application is a continuation application of U.S. application Ser. No. 16/260,794, filed on Jan. 29, 2019, having inventors Thomas P. Dolbear et al., titled "BACK SIDE METALLIZATION", which is a divisional application of U.S. application Ser. No. 15/669,361 (now U.S. Pat. No. 10,242,962), filed on Aug. 4, 2017, having inventors Thomas P. Dolbear et al., titled "BACK SIDE METALLIZATION", which are owned by instant Assignee and are incorporated herein by reference.

BACKGROUND OF THE DISCLOSURE

The disclosure relates to semiconductor devices and the manufacturing of semiconductor devices. More specifically, the disclosure relates to improved back side metallization for integrated circuit device wafers and die.

Integrated circuits are used in computing devices such as, but not limited to, smart phones, tablets, wearables, laptops, desktops, internet servers, printers, and other devices. Integrated circuits can have very dense circuitry and can operate at very high frequencies to provide ever-improving levels of performance. Some devices may have multiple processor cores and/or very large memory arrays on relatively small die. In operation, such devices can produce heat in excess of 100 watts. If the heat is allowed to build up on the die, the performance of the integrated circuit may be degraded and/or the life of the integrated circuit may be significantly shortened.

In some integrated circuits, a thermally conductive layer is applied to the back side of the die and bonded to a heat sink, such a package lid. The package lid can have larger area than the back side of the die and may be exposed to a convective flow of air to remove heat from the package lid. The thermally conductive layer can provide a thermal path through which the heat may flow from the die to the package lid to dissipate from the package lid.

The flow of heat through the heat path can be significantly reduced if the bond between the thermally conductive layer and the back side of the die fails. Thus, good adhesion between the back side of the die and the thermally conductive layer is an important factor in removing the heat build-up and consequently, in the reliability of the integrated circuit device.

BRIEF DESCRIPTION OF THE DRAWINGS

The disclosure will be more readily understood in view of the following description when accompanied by the below figures and wherein like reference numerals represent like elements, wherein.

DETAILED DESCRIPTION OF EMBODIMENTS

Embodiments of the disclosure include back side metallization structures that can provide good adhesion between a back side of an integrated circuit die and a thermally conductive layer to enable reliable dissipation of heat from the integrated circuit during operation. In one example, an integrated circuit device wafer includes a silicon wafer substrate and a back side metallization structure. The silicon wafer substrate has a front side surface and a back side surface opposite the front side surface. The silicon wafer substrate includes a plurality of integrated circuits on front side surface. The back side metallization structure on the back side surface includes a first adhesion layer, a first metal layer, a second metal layer, and a second adhesion layer. The first adhesion layer is on the back side surface. The first adhesion layer includes at least one of: silicon nitride and silicon dioxide. The first metal layer is over the first adhesion layer. The first metal layer includes titanium. The second metal layer is over the first metal layer. The second metal layer includes nickel and, optionally, vanadium. The second adhesion layer is over the second metal layer. The second adhesion layer includes at least one of: silver, gold, and tin.

In one example, the device wafer further includes a plurality of solder bumps on the front side surface of the wafer substrate, the solder bumps electrically connected to the plurality of integrated circuits. In one example, the first adhesion layer has a thickness from 100 nanometers to 400 nanometers. In one example, the first adhesion layer consists of silicon nitride. In one example, the second adhesion layer is silver. In another example, the second adhesion layer consists of tin. In yet another example, the second adhesion layer consists of gold. In one example, each of the plurality of integrated circuits includes central processing unit cores.

In another example, an integrated circuit device wafer includes a silicon wafer substrate and a back side metallization structure. The silicon wafer substrate has a front side surface and a back side surface opposite the front side surface. The silicon wafer substrate includes a plurality of integrated circuits on front side surface. The back side metallization structure on the back side surface includes a first adhesion layer, a first metal layer, a second metal layer, and a second adhesion layer. The first adhesion layer is on the back side surface. The first adhesion layer includes aluminum. The first metal layer is over the first adhesion layer. The first metal layer includes titanium. The second metal layer is over the first metal layer. The second metal layer includes nickel and, optionally, vanadium. The second adhesion layer is over the second metal layer. The second adhesion layer includes at least one of: silver and tin.

In one example, the device wafer further includes a plurality of solder bumps on the front side surface of the wafer substrate, the solder bumps electrically connected to the plurality of integrated circuits. In one example, the first adhesion layer has a thickness from 100 nanometers to 400 nanometers. In one example, the second adhesion layer consists of silver. In another example, the second adhesion layer consists of tin. In one example, each of the plurality of integrated circuits includes central processing unit cores.

In one example, a method of forming a metallization structure on a back side of a silicon wafer substrate includes forming a first adhesion layer on the back side of the silicon wafer substrate, forming a first barrier layer including titanium metal over the first adhesion layer, forming a second barrier layer including nickel and, optionally, vanadium over the first barrier layer; and forming a second adhesion layer over the second barrier layer. The silicon wafer substrate includes a plurality of integrated circuits formed on a front side of the silicon wafer substrate. The first adhesion layer includes at least one of: silicon dioxide and silicon nitride. The second adhesion layer includes at least one of: silver, gold, and tin.

In one example, the first adhesion layer is formed by chemical vapor deposition. In one example, the first adhesion layer has a thickness from 100 nanometers to 400 nanometers. In one example, the first adhesion layer consists of silicon nitride. In one example, the second adhesion layer consists of silver. In another example, the second adhesion layer consists of tin.

In one example, a method of forming a metallization structure on a back side of a silicon wafer substrate includes forming a first adhesion layer on the back side of the silicon wafer substrate, forming a first barrier layer including aluminum over the first adhesion layer, forming a second barrier layer including nickel and, optionally, vanadium over the first barrier layer; and forming a second adhesion layer over the second barrier layer. The silicon wafer substrate includes a plurality of integrated circuits formed on a front side of the silicon wafer substrate. The first adhesion layer includes at least one of: silicon dioxide and silicon nitride. The second adhesion layer includes at least one of: silver and tin.

In one example, the first adhesion layer has a thickness from 100 nanometers to 400 nanometers. In one example, the second adhesion layer consists of silver. In another example, the second adhesion layer consists of tin.

In another example, an apparatus includes a package substrate, a lid attached to the package substrate, a plurality of integrated circuit die disposed between the package substrate and the lid, and a plurality of thermal conduction layers physically connecting the back side surface of each of the plurality of integrated circuit die to the lid. Each of the plurality of integrated circuit die are physically and electrically connected to the package substrate. Each of the plurality of integrated circuit die includes a silicon substrate and a back side metallization structure. The silicon substrate has a front side surface and a back side surface opposite the front side surface. The silicon substrate includes an integrated circuit device on front side surface. The back side metallization structure on the back side surface includes a first adhesion layer, a first metal layer, a second metal layer, and a second adhesion layer. The first adhesion layer is on the back side surface. The first adhesion layer includes at least one of: silicon nitride and silicon dioxide. The first metal layer is over the first adhesion layer. The first metal layer includes titanium. The second metal layer is over the first metal layer. The second metal layer includes nickel and, optionally, vanadium. The second adhesion layer is over the second metal layer. The second adhesion layer includes at least one of: silver, gold, and tin.

In one example, the plurality of thermal conduction layers includes iridium. In one example, the plurality of integrated circuit die includes at least one of: central processing unit cores, graphics processing unit cores, and memory. In one example, the die of the plurality of integrated circuit die are not all the same.

Another example is a method of forming an apparatus including a package substrate, a lid attached to the package substrate, and a plurality of integrated circuit die disposed between the package substrate and the lid, each of the plurality of integrated circuit die physically and electrically connected to the package substrate. The method includes forming a metallization structure on a back side of a silicon wafer substrate, in which the silicon wafer substrate includes a plurality of integrated circuits formed on a front side of the silicon wafer substrate. Forming the metallization structure includes forming a first adhesion layer including at least one of: silicon dioxide and silicon nitride on the back side of the silicon wafer substrate, forming a first barrier layer including titanium metal over the first adhesion layer, forming a second barrier layer including nickel and, optionally, vanadium over the first barrier layer, and forming a second adhesion layer including at least one: of silver, gold, and tin over the second barrier layer. The method further includes cutting the silicon wafer substrate into a plurality of die, each of the die including one of the plurality of integrated circuits, and attaching physically and electrically at least two of the plurality of the die to the package substrate. The method further includes applying a plurality of indium preforms by applying at least one of the plurality of preforms to the second adhesion layer for each of the integrated circuit die. The method further includes attaching the lid to the package substrate and reflowing the plurality of indium preforms to physically bond the indium to the second adhesion layer of each of the at least two of the plurality of die.

In another example, an apparatus includes a package substrate, a lid attached to the package substrate, a plurality of integrated circuit die disposed between the package substrate and the lid, and a plurality of thermal conduction layers physically connecting the back side surface of each of the plurality of integrated circuit die to the lid. Each of the plurality of integrated circuit die is physically and electrically connected to the package substrate. Each of the plurality of integrated circuit die includes a silicon substrate and a back side metallization structure. The silicon substrate has a front side surface and a back side surface opposite the front side surface. The silicon substrate includes an integrated circuit device on front side surface. The back side metallization structure on the back side surface includes a first adhesion layer, a first metal layer, a second metal layer, and a second adhesion layer. The first adhesion layer is on the back side surface. The first adhesion layer includes aluminum. The first metal layer is over the first adhesion layer. The first metal layer includes titanium. The second metal layer is over the first metal layer. The second metal layer includes nickel and, optionally, vanadium. The second adhesion layer is over the second metal layer. The second adhesion layer includes at least one of: silver and tin.

In one example, the plurality of thermal conduction layers includes iridium. In one example, the plurality of integrated circuit die includes at least one of: central processing unit cores, graphics processing unit cores, and memory. In one example, the die of the plurality of integrated circuit die are not all the same.

Another example is a method of forming an apparatus including a package substrate, a lid attached to the package substrate, and a plurality of integrated circuit die disposed between the package substrate and the lid, each of the plurality of integrated circuit die physically and electrically connected to the package substrate. The method includes forming a metallization structure on a back side of a silicon wafer substrate, in which the silicon wafer substrate includes a plurality of integrated circuits formed on a front side of the silicon wafer substrate. Forming the metallization structure includes forming a first adhesion layer including aluminum on the back side of the silicon wafer substrate, forming a first barrier layer including titanium metal over the first adhesion layer, forming a second barrier layer including nickel and, optionally, vanadium over the first barrier layer, and forming a second adhesion layer including at least one: of silver and tin over the second barrier layer. The method further includes cutting the silicon wafer substrate into a plurality of die, each of the die including one of the plurality of integrated circuits, and attaching physically and electrically at least two of the plurality of the die to the package substrate. The method further includes applying a plurality of indium preforms by applying at least one of the plurality of preforms to the second adhesion layer for each of the integrated circuit die. The method further includes attaching the lid to the package substrate and reflowing the plurality of indium preforms to physically bond the indium to the second adhesion layer of each of the at least two of the plurality of die.

In another example, an apparatus includes a package substrate, a lid attached to the package substrate, a plurality of integrated circuit die disposed between the package substrate and the lid, and a plurality of thermal conduction layers physically connecting the back side surface of each of the plurality of integrated circuit die to the lid. The plurality of thermal conduction layers includes indium. Each of the plurality of integrated circuit die is physically and electrically connected to the package substrate. Each of the plurality of integrated circuit die includes a silicon substrate and a back side metallization structure. The silicon substrate has a front side surface and a back side surface opposite the front side surface. The silicon substrate includes an integrated circuit device on front side surface. The back side metallization structure on the back side surface includes a first metal layer, a second metal layer, and an adhesion layer. The first metal layer is on the back side surface. The first metal layer includes titanium. The second metal layer is over the first metal layer. The second metal layer includes nickel. The adhesion layer is over the second metal layer. The adhesion layer includes at least one of: silver, gold, and tin.

In one example, the second metal layer consists of nickel. In one example, the plurality of integrated circuit die includes at least one of: central processing unit cores, graphics processing unit cores, and memory. In one example, the die of the plurality of integrated circuit die are not all the same.

Another example is a method of forming an apparatus including a package substrate, a lid attached to the package substrate, and a plurality of integrated circuit die disposed between the package substrate and the lid, each of the plurality of integrated circuit die physically and electrically connected to the package substrate. The method includes forming a metallization structure on a back side of a silicon wafer substrate, in which the silicon wafer substrate includes a plurality of integrated circuits formed on a front side of the silicon wafer substrate. Forming the metallization structure includes evaporating a first metal layer including titanium onto the back side of the silicon wafer substrate, evaporating a second metal layer including nickel over the first metal layer, and evaporating an adhesion layer including at least one: of silver, gold, and tin over the second metal layer. The method further includes cutting the silicon wafer substrate into a plurality of die, each of the die including one of the plurality of integrated circuits, and attaching physically and electrically at least two of the plurality of the die to the package substrate. The method further includes applying a plurality of indium preforms by applying at least one of the plurality of preforms to the second adhesion layer for each of the integrated circuit die. The method further includes attaching the lid to the package substrate and reflowing the plurality of indium preforms to physically bond the indium to the second adhesion layer of each of the at least two of the plurality of die.

Figure 1:
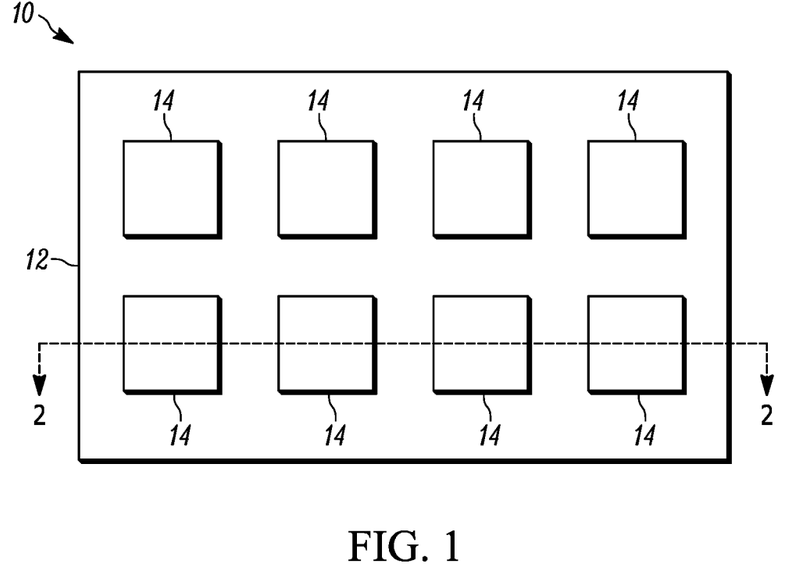
FIG. 1 is a schematic top view of a multi-chip package, according to some embodiments of the disclosure.

FIG. 1 is a schematic top view of a multi-chip package 10, according to some embodiments of the disclosure. FIG. 1 shows the multi-chip package 10 includes a package base 12 and a plurality of integrated circuit die 14. The package base may be formed of ceramic, metal, and/or plastic, and includes electrical traces (not shown) to connect at least some of the integrated circuit die 14 to electrical connections (not shown) outside of the package, as is known in the art. In some embodiments, the package base may further include additional electrical traces (not shown) to connect at least some of the integrated circuit die 14 to other of the integrated circuit die.

The plurality of integrated circuit die 14 can be, for example, and without limitation, central processing units, graphics processing units, memory units, or input/output units, network processors, field programmable gate arrays, and programmable logic devices. In some embodiments, some of the plurality of integrated circuit die 14 can include combinations of any of the forgoing integrated circuits. For ease of illustration, the plurality of integrated circuit die 14 is shown as identical. However, it is understood that embodiments include multi-chip package 10 in which the plurality of integrated circuit die 14 are not all the same. For example, in some embodiments, some of the plurality of integrated circuit die 14 can include central processing units, while others include memory units, and still others include input/output units. Many combinations are possible. In addition, although the plurality of integrated circuit die 14 in the multi-chip package 10 is shown as including eight integrated circuit die 14, it is understood that embodiments include multi-chip packages 10 having as few as two integrated circuit die 14 or as many as 100 integrated circuit die 14.

Figure 2:
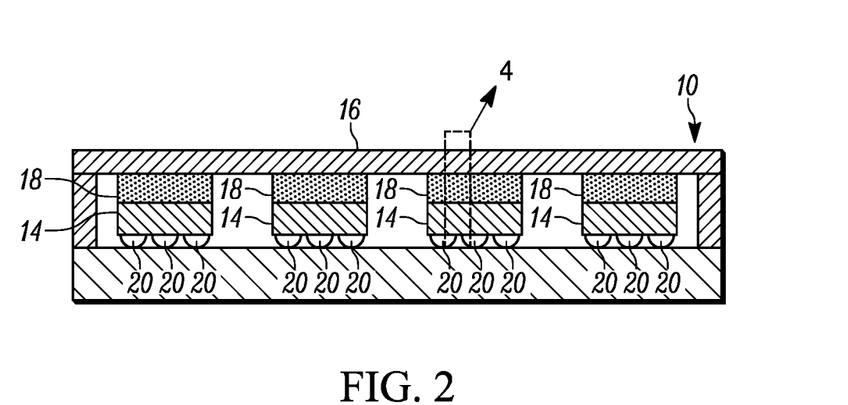
FIG. 2 is a schematic side cross-sectional view of the multi-chip module of FIG. 1, according to some embodiments of the disclosure.

FIG. 2 is a schematic side cross-sectional view of the multi-chip package 10 of FIG. 1, according to some embodiments of the disclosure. As shown in FIG. 2, the multi-chip package 10 further includes a lid 16 and a plurality of thermal conduction layers 18, one thermal conduction layer 18 for each of the integrated circuit die 14. As further shown in FIG. 2, each of the integrated circuit die 14 includes a plurality of solder bumps 20 (three shown for each in FIG. 2). The lid 16 may be made by stamping and formed of nickel plated copper. The thermal conduction layers 18 may be formed of a material having a high degree of thermal conductivity and that will readily bond to metal surfaces. In some embodiments, the thermal conduction layer 18 can be indium. Indium can bond to well to some metals when reflowed at around 150° C., provided that a flux is also employed, as is known in the art. The solder bumps 20 can be formed of a material having a high degree of electrical conductivity and that will readily bond to metal surfaces when reflowed. Such materials are known in the art.

The lid 16 can be bonded to the package base 12 at the periphery of the package base 12, as shown in FIG. 2. The lid 16 may be bonded to the package base 12 by, for example, an adhesive, as is known in the art. So disposed, the lid 16 can protect the plurality of integrated circuit die 14 from physical and environmental hazards. The solder bumps 20 electrically connect the integrated circuit die 14 to the package base 12. The thermal conduction layer 18 is disposed between the integrated circuit die 14 and the lid 16. So disposed, the thermal conduction layer is able to provide a thermal path from the integrated circuit die 14 to the lid 16. The lid 16 has a larger surface area than the integrated circuit die 14 and may also be exposed to external convective air currents. Together, effects can make the lid 16 an effective heat sink.

In operation, each of the plurality of integrated circuit die 14 can produce significant heat which must be dissipated to prevent detrimental effects, as described above. The heat can be conducted from the integrated circuit die 14 through the thermal conduction layer 18 and to the lid 16 where it is removed by external convective air currents.

Figure 3:
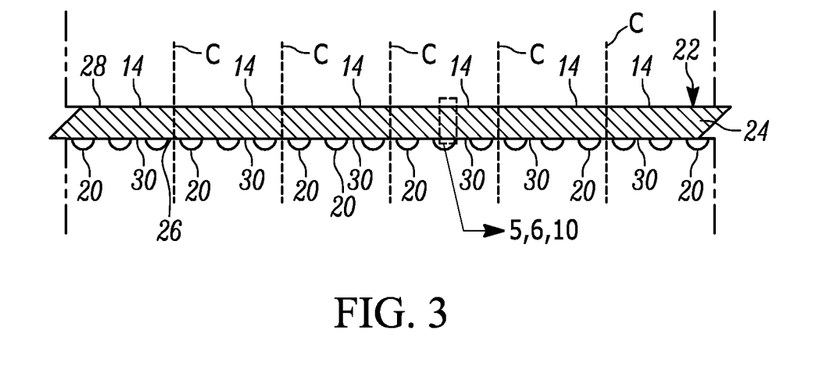
FIG. 3 is a schematic side cross-sectional view of an integrated circuit device wafer, according to some embodiments of the disclosure.

FIG. 3 is a schematic side cross-sectional view of a portion of an integrated circuit device wafer 22, according to some embodiments of the disclosure. FIG. 3 shows the integrated circuit device wafer 22 includes a silicon wafer substrate 24 having a front side surface 26 and a back side surface 28 opposite the front side surface 26. The silicon wafer substrate 34 also includes a plurality of integrated circuits 30 (shown in FIG. 4). The plurality of solder bumps 20 are formed on the front of the silicon wafer substrate 24, as descried above. The silicon wafer substrate 26 can be diced along illustrated cut lines C to form the plurality of integrated circuit die 14, each with at one of the plurality of integrated circuits 30. The dicing can be by any number of methods known in the art including, for example, sawing or laser cutting.

Figure 4:
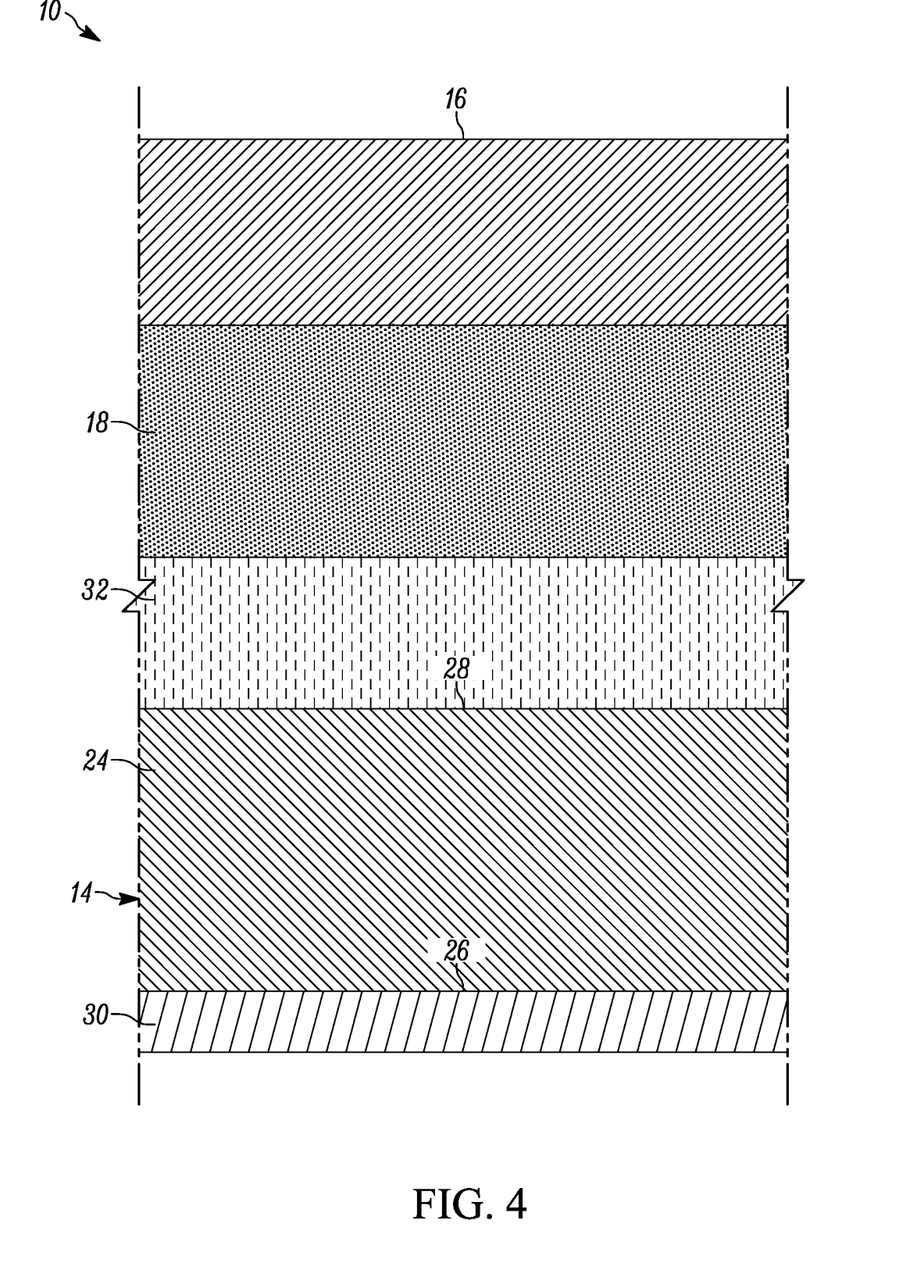
FIG. 4 is a magnified schematic side cross-sectional view of a portion of the multi-chip module of FIG. 2, according to some embodiments of the disclosure.

FIG. 4 is a magnified schematic side cross-sectional view of a portion of the multi-chip package 10 of FIG. 2, according to some embodiments of the disclosure. As shown in FIG. 4, the integrated circuit die 14 includes one of the integrated circuit 30 on the front surface 26 of the silicon wafer substrate 24 and a back side metallization structure 32 on the back side surface 28.

The back side metallization structure 32 is described in greater detail below in reference to FIGS. 5, 6, and 10 for various embodiments. The back side metallization structure 32 provides a metal surface to which the thermal conduction layer 18 can readily bond. In addition, the back side metallization structure 32 can be well adhered to the silicon wafer substrate 24 to provide a reliable thermal path from the integrated circuit die 14 to the thermal conduction layer 18.

In FIG. 4, and in FIGS. 5-6 and 10 discussed below, the solder bumps 20 which physically and electrically connect to the integrated circuit 32 are omitted for clarity. In addition, for the purposes of clarity and ease of illustration, the elements shown are not shown to scale.

Figure 5:
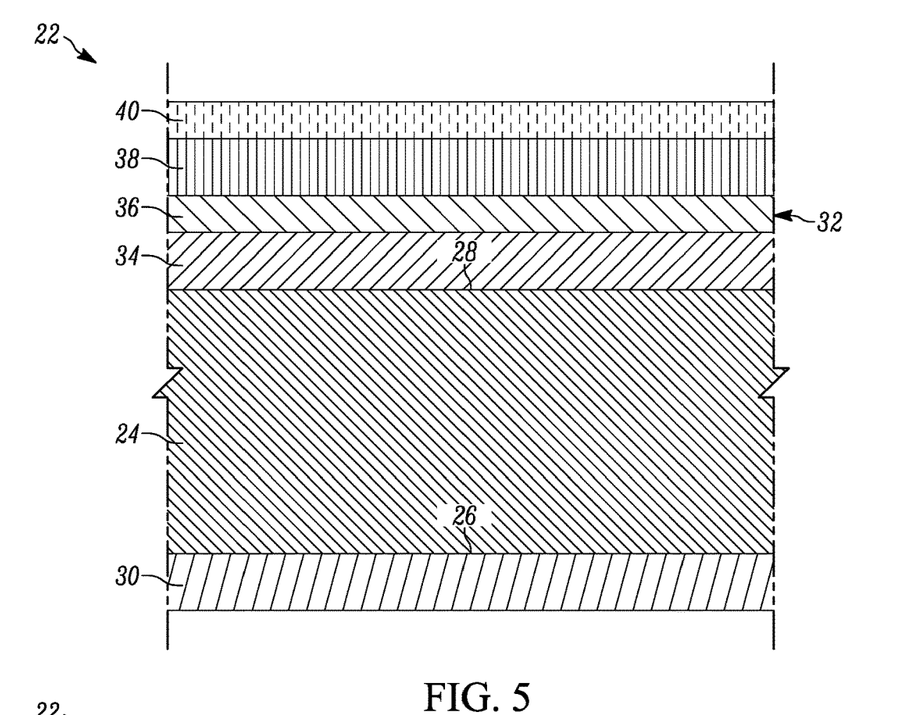
FIG. 5 is a magnified schematic side cross-sectional view of a portion of the integrated circuit device wafer of FIG. 4, according to some embodiments of the disclosure

FIG. 5 is a magnified schematic side cross-sectional view of a portion of the integrated circuit device wafer 22 of FIG. 4, according to some embodiments of the disclosure. In the embodiment shown in FIG. 5, the back side metallization structure 32 includes a first adhesion layer 34, a first metal layer 36, a second metal layer 38, and a second adhesion layer 40. The first metal layer 34 and the second metal layer 36 can act as barrier layers to prevent the thermal conduction layer 18 from passing through the back side metallization structure 34 to the silicon wafer substrate 24 where it could be detrimental to the integrated circuit 30. In the embodiment of FIG. 5, the first adhesion layer 34 can be silicon dioxide, silicon nitride, or a combination of the two, such as, silicon oxynitride. In some embodiments, the first adhesion layer 34 can be formed by chemical vapor deposition techniques, such as low pressure chemical vapor deposition, or plasma enhanced chemical vapor deposition, as is known in the art. In some embodiments, the first adhesion layer 34 can have a thickness from 100 nanometers to 400 nanometers. If the first adhesion layer 34 is thinner than 100 nanometers, it may not completely cover the surface features of the back side surface 28 of the silicon wafer substrate 24, leading to gaps in the adhesion of the back side metallization structure 32 to the silicon wafer substrate 24. If the first adhesion layer 34 is thicker than 400 nanometers, it may reduce the thermal conductivity through the back side metallization layer 34 without providing any corresponding benefit.

The first metal layer 36 can include titanium. In some embodiments, the first metal layer 36 consists of titanium. In some embodiments, the titanium can be deposited by sputter deposition. In other embodiments, the titanium can be deposited by evaporative deposition. The techniques of sputter deposition and evaporative deposition to deposit metals are well known in the art.

The second metal layer 38 can include nickel and, optionally, vanadium. In some embodiments, the first metal layer 38 consists of nickel and vanadium. In some embodiments, the nickel and vanadium can be deposited by sputter deposition. Sputtering the vanadium along with the nickel disrupts the natural ferromagnetic properties of the nickel, which could otherwise interfere with the sputter deposition process. In other embodiments, the first layer 38 consists of nickel. In some embodiments, the nickel can be deposited by evaporative deposition.

The second adhesion layer 40 can include silver, gold, or tin, or combinations of any of the foregoing. In some embodiments, the second adhesion layer 40 consists of silver. In other embodiments, the second adhesion layer 40 consists of gold. In still other embodiments, the second adhesion layer 40 consists of tin.

Figure 6:
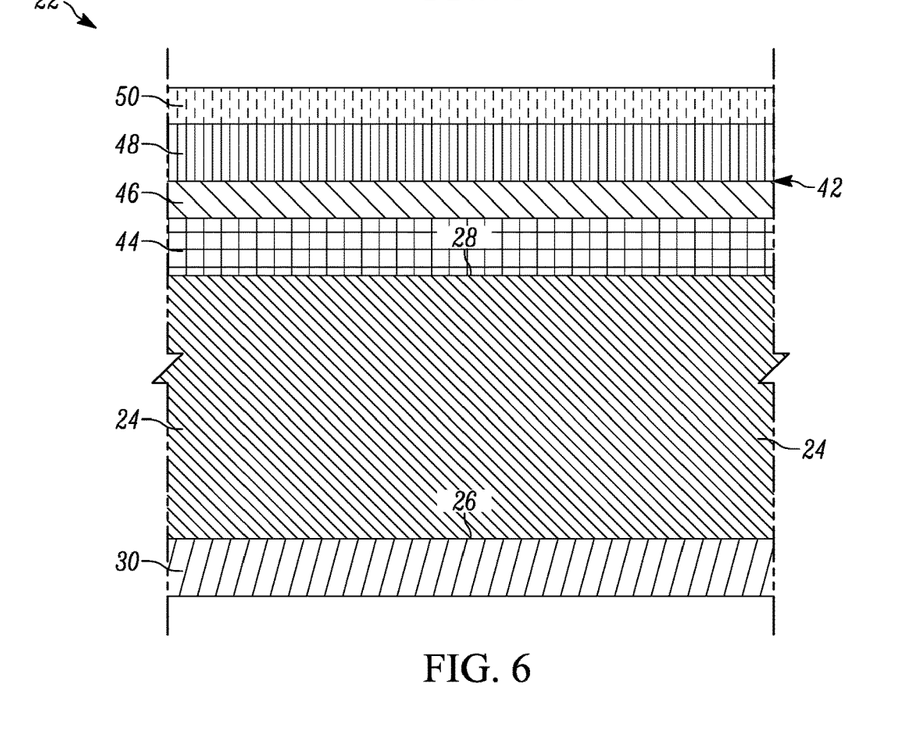
FIG. 6 is a magnified schematic side cross-sectional view of a portion of the integrated circuit device wafer of FIG. 4, according to some other embodiments of the disclosure.

FIG. 6 is a magnified schematic side cross-sectional view of a portion of the integrated circuit device wafer 22 of FIG. 4, according to some other embodiments of the disclosure. The embodiment of FIG. 6 is substantially identical to the embodiment of FIG. 5, except that the back side metallization structure 32 is replaced by the back side metallization structure 34. In the embodiment shown in FIG. 6, the back side metallization structure 42 includes a first adhesion layer 44, a first metal layer 46, a second metal layer 48, and a second adhesion layer 50. The first metal layer 44 and the second metal layer 46 can act as barrier layers. In the embodiment of FIG. 6, the first adhesion layer 44 can include aluminum, for example, aluminum metal and aluminum alloys. In some embodiments, the first adhesion layer 44 can consist of aluminum metal. In some embodiments, the first adhesion layer 44 can be formed by sputter deposition or evaporative deposition, as is known in the art. In some embodiments, the first adhesion layer 44 can have a thickness from 100 nanometers to 400 nanometers.

The first metal layer 46 can include titanium. In some embodiments, the first metal layer 46 consists of titanium. In some embodiments, the titanium can be deposited by sputter deposition. In other embodiments, the titanium can be deposited by evaporative deposition.

The second metal layer 48 can include nickel and, optionally, vanadium. In some embodiments, the second metal layer 48 consists of nickel and vanadium. In some embodiments, the nickel and vanadium can be deposited by sputter deposition. In other embodiments, the first layer 38 consists of nickel. In some embodiments, the nickel can be deposited by evaporative deposition.

The second adhesion layer 50 can include silver, or tin, or combinations of any of the foregoing. In some embodiments, the second adhesion layer 50 consists of silver. In other embodiments, the second adhesion layer 50 consists of tin.

Figure 7:
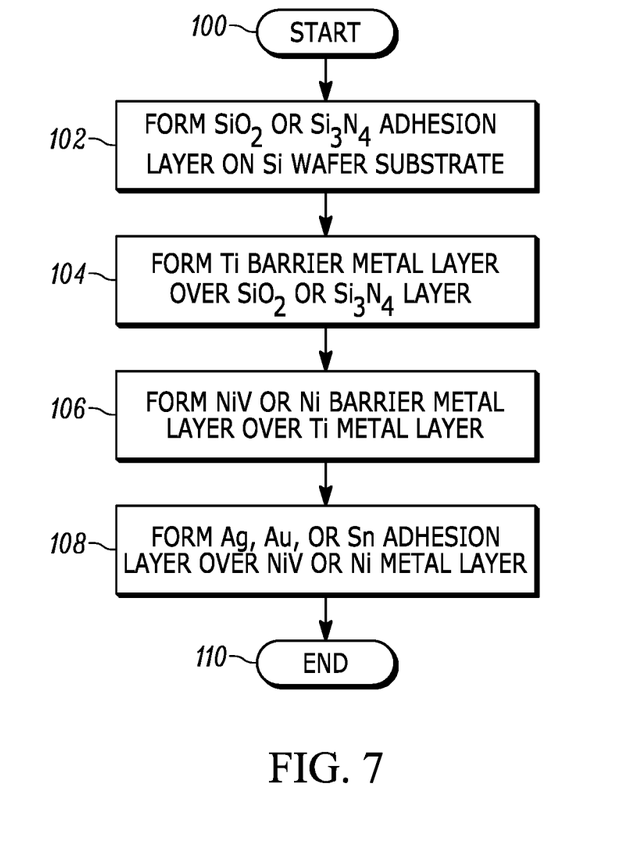
FIG. 7 is a flowchart illustrating a method for forming a metallization structure on a back side of a silicon wafer substrate, according to some embodiments of the disclosure.

FIG. 7 is a flowchart illustrating a method for forming the metallization structure 32 on a back side 26 of a silicon wafer substrate 24, according to some embodiments of the disclosure. The method begins at step 100 by forming the first adhesion layer 34 of silicon dioxide or silicon nitride on the back side 28 of the silicon wafer substrate 24 at step 102. This may be done by chemical vapor deposition, such as low pressure chemical vapor deposition, or plasma enhanced chemical vapor deposition. Next, at step 104, the first metal layer, or first barrier layer, 36 of titanium metal is formed over the first adhesion layer 34. This may be done by sputter deposition or evaporative deposition. Next, at step 106, the second metal layer, or second barrier layer, 38 including nickel and, optionally, vanadium is formed over the first barrier layer 36. This may be done by sputter deposition or evaporative deposition. Next, at step 108, the second adhesion layer 40 of silver, gold, or tin is formed over the second barrier layer 38. The second adhesion layer 40 may be formed by sputter deposition or evaporative deposition to complete the metallization structure at step 110.

Figure 8:
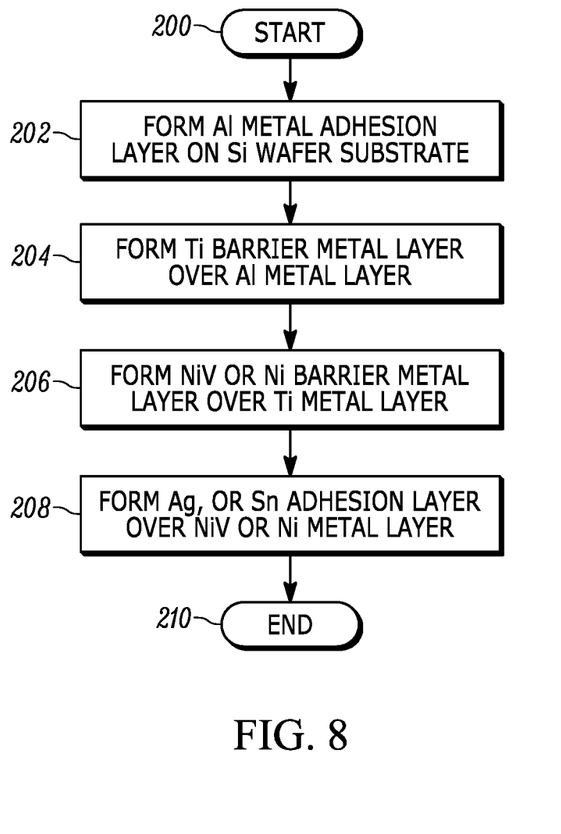
FIG. 8 is a flow chart illustrating a method for forming a metallization structure on a back side of a silicon wafer substrate, according to some other embodiments of the disclosure.

FIG. 8 is a flow chart illustrating a method for forming the metallization structure 42 on a back side 26 of a silicon wafer substrate 24, according to some embodiments of the disclosure. The method begins at step 200 by forming the first adhesion layer 44 of aluminum metal on the back side 28 of the silicon wafer substrate 24 at step 202. This may be done by sputter deposition or evaporative deposition. Next, at step 204, the first metal layer, or first barrier layer, 46 of titanium metal is formed over the first adhesion layer 44. This may also be done by sputter deposition or evaporative deposition. Next, at step 206, the second metal layer, or second barrier layer, 48 including nickel and, optionally, vanadium is formed over the first barrier layer 46. This may be done by sputter deposition or evaporative deposition. Next, at step 208, the second adhesion layer 50 of silver or tin is formed over the second barrier layer 48. The second adhesion layer 50 may be formed by sputter deposition or evaporative deposition to complete the metallization structure at step 210.

Figure 9:
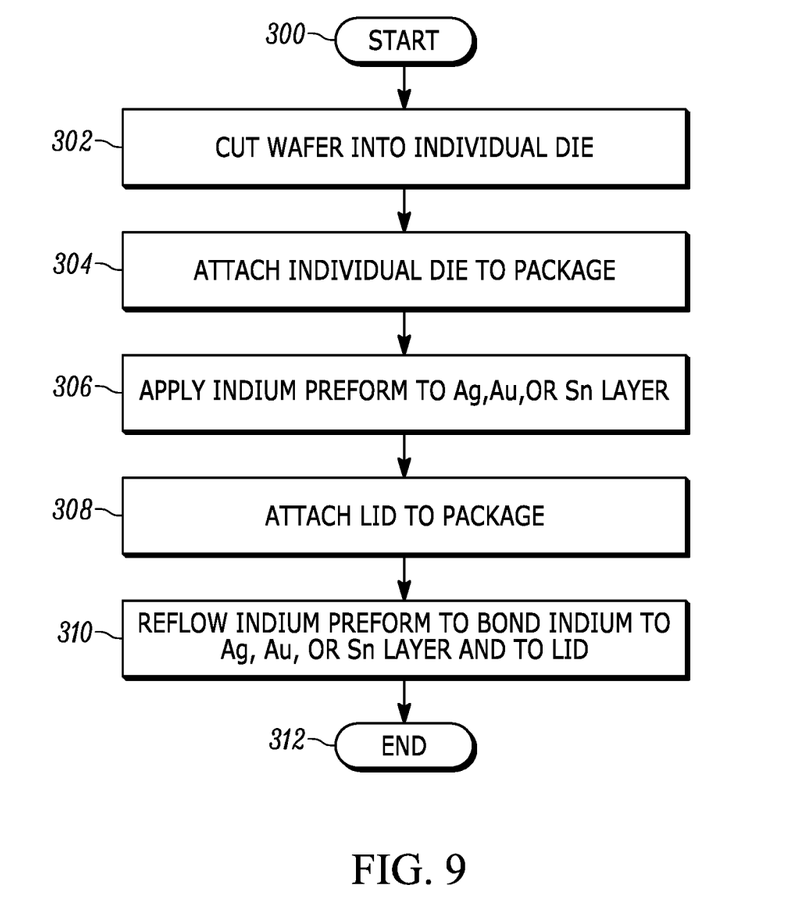
FIG. 9 is a flowchart illustrating a method for making an apparatus including a package substrate, a lid attached to the package substrate, and a plurality of integrated circuit die from an integrated circuit device wafer, according to some embodiments of the disclosure.

FIG. 9 is a flowchart illustrating a method for making an apparatus, such as the multi-chip package 10 including the package substrate 12, the lid 16 attached to the package substrate 12, and a plurality of integrated circuit die 14 from the integrated circuit device wafer 22 attached to the package substrate 12, according to some embodiments of the disclosure. The method begins at step 300 by cutting the integrated circuit device wafer 22 into individual integrated circuit die 14 at step 302. This may be done by sawing or laser cutting, as is known in the art. Next, at step 304, the individual integrated circuit die 14 are physically attached and electrically connected to the package substrate 12 by, for example, reflowing the solder bumps 20 to that they adhere to electrical traces in the package substrate 12. Next, in step 306, at least one indium preform is applied to each of the plurality of integrated circuit die 14. Depending on the embodiment, the indium preform is applied to the silver, gold, or tin of second adhesion layer 40, or to the silver or tin second adhesion layer 50. Next, at step 308, the lid 16 is attached to the package substrate 12 by an adhesive, as is known in the art. Next, at step 310, the indium preform 16 is reflowed to bond the indium to the silver, gold, or tin of second adhesion layer 40 (or to the silver or tin second adhesion layer 50) and to the lid 16 to complete the multi-chip package 10 at step 210.

Figure 10:
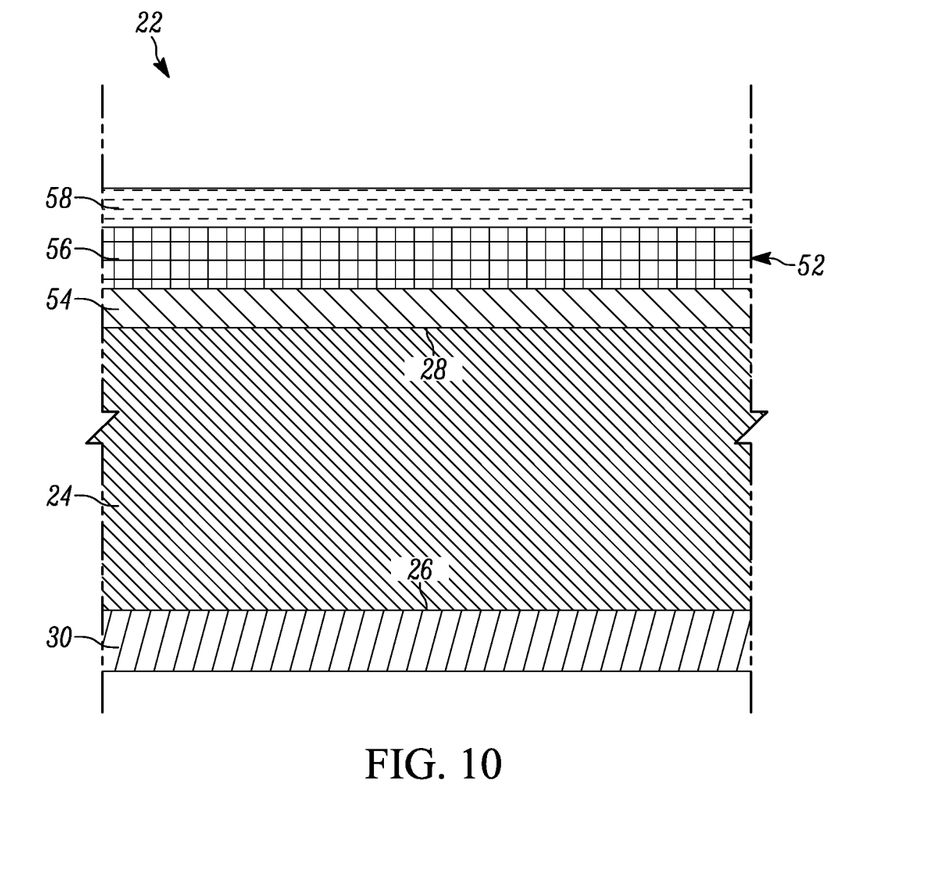
FIG. 10 is a magnified schematic side cross-sectional view of a portion of the integrated circuit device wafer of FIG. 4, according to some other embodiments of the disclosure.

FIG. 10 is a magnified schematic side cross-sectional view of a portion of the integrated circuit device wafer 22 of FIG. 4, according to some other embodiments of the disclosure. The embodiment of FIG. 10 is substantially identical to the embodiments of FIGS. 5 and 6, except that the back side metallization structures 32 and 42 are replaced by the back side metallization structure 52. In the embodiment shown in FIG. 10, the back side metallization structure 52 includes a first metal layer 54, a second metal layer 56, and an adhesion layer 58. The first metal layer 54 can act as both an adhesion layer and a barrier layer. In the embodiment of FIG. 10, the metal layer 54 can include titanium. In some embodiments, the first metal layer 54 can consist of titanium metal. In some embodiments, the first metal layer 54 can have a thickness from 100 nanometers to 400 nanometers.

The second metal layer 56 can include nickel and can act as a barrier layer. In some embodiments, the second metal layer 56 consists of nickel. The adhesion layer 58 can include silver, gold, or tin, or combinations of any of the foregoing. In some embodiments, the adhesion layer 58 consists of silver. In other embodiments, the adhesion layer 58 consists of gold. In other embodiments, the adhesion layer 58 consists of tin.

Figure 11:
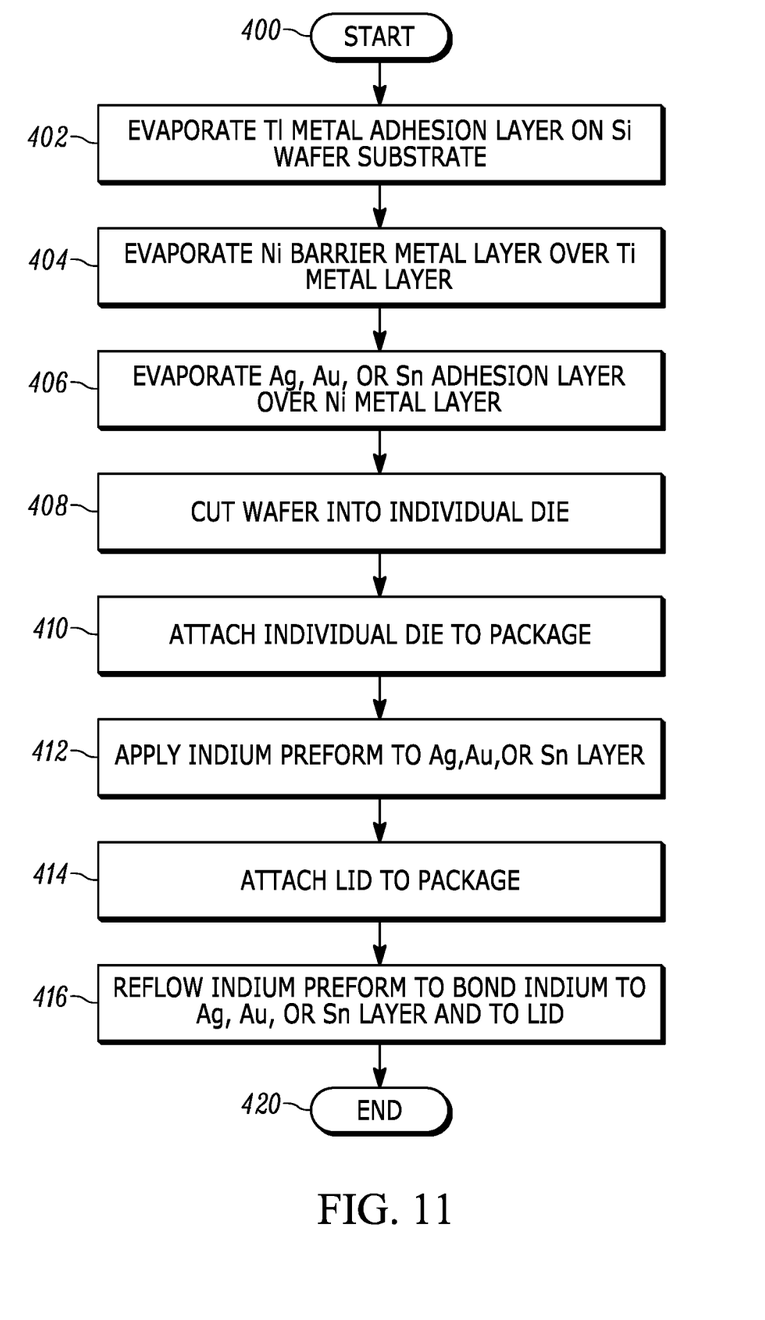
FIG. 11 is a flowchart illustrating a method for making an apparatus including a package substrate, a lid attached to the package substrate, and a plurality of integrated circuit die from an integrated circuit device wafer including forming a metallization structure on a back side of the integrated circuit device wafer, according to some other embodiments of the disclosure.

FIG. 11 is a flowchart illustrating a method for making an apparatus, such as the multi-chip package 10 including the package substrate 12, the lid 16 attached to the package substrate 12, and a plurality of integrated circuit die 14 from the integrated circuit device wafer 22 attached to the package substrate 12, according to some embodiments of the disclosure. The method begins at step 400 by forming the first metal layer 54 of titanium metal on the back side 28 of the silicon wafer substrate 24 at step 402. This is done by evaporative deposition. Next, at step 404, the second metal layer 56 of nickel is formed over the first metal layer 54. This is also done by sputter deposition. Next, at step 406, the adhesion layer 58 of silver, gold, or tin is formed over the second metal layer 56. The adhesion layer 58 is formed by evaporative deposition to complete the metallization structure 52. Next, at step 408, the integrated circuit device wafer 22 is cut into individual integrated circuit die 14. This may be done by sawing or laser cutting, as is known in the art. Next, at step 410, the individual integrated circuit die 14 are physically attached and electrically connected to the package substrate 12 by, for example, reflowing the solder bumps 20 to that they adhere to electrical traces in the package substrate 12. Next, in step 412, at least one indium preform is applied to each of the plurality of integrated circuit die 14. Depending on the embodiment, the indium preform is applied to the silver, gold, or tin of adhesion layer 58. Next, at step 414, the lid 16 is attached to the package substrate 12 by an adhesive, as is known in the art. Next, at step 416, the indium preform 16 is reflowed to bond the indium to the silver, gold, or tin of the adhesion layer 52 and to the lid 16 to complete the multi-chip package 10 at step 420.

The above detailed description and the examples described therein have been presented for the purposes of illustration and description only and not for limitation. For example, the operations described may be done in any suitable manner. It is therefore contemplated that the present embodiments cover any and all modifications, variations or equivalents that fall within the scope of the basic underlying principles disclosed above and claimed herein. Furthermore, while the above description describes hardware in the form of a processor executing code, hardware in the form of a state machine or dedicated logic capable of producing the same effect, other structures are also contemplated.

What is claimed is:

1. An integrated circuit device comprising:
   a package comprising at least one integrated circuit covered by a lid, the integrated circuit having a front side surface and a back side surface opposite the front side surface; and
   a back side metallization structure on the back side surface, the back side metallization structure including:
      a first adhesion layer on the back side surface, the first adhesion layer including aluminum;
      a first metal layer over the first adhesion layer, the first metal layer including titanium;
      a second metal layer over the first metal layer, the second metal layer including nickel;
      a second adhesion layer over the second metal layer, the second adhesion layer including at least one of: silver, gold and tin; and
      reflowed indium from an indium preform formed between the lid and the second adhesion layer.

2. The integrated circuit device of claim 1, wherein the first adhesion layer has a thickness from 100 nanometers to 400 nanometers.

3. The integrated circuit device of claim 1, wherein the second metal layer further includes vanadium.

4. The integrated circuit device of claim 1, wherein the second adhesion layer consists of silver.

5. The integrated circuit device of claim 1, wherein the at least one integrated circuit includes central processing unit cores.

* * * * *